United States Patent
Aoyama et al.

(10) Patent No.: US 8,383,452 B2
(45) Date of Patent: Feb. 26, 2013

(54) SEMICONDUCTOR DEVICE AND METHOD FOR MANUFACTURING THE SAME

(75) Inventors: Tomonori Aoyama, Yokohama (JP); Kiyotaka Miyano, Tokyo (JP); Yusuke Oshiki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 137 days.

(21) Appl. No.: 13/017,498

(22) Filed: Jan. 31, 2011

(65) Prior Publication Data

US 2012/0025200 A1 Feb. 2, 2012

(30) Foreign Application Priority Data

Jul. 30, 2010 (JP) .................................. 2010-172608

(51) Int. Cl.
*H01L 21/00* (2006.01)
*H01L 31/0376* (2006.01)

(52) U.S. Cl. .............. 438/97; 438/95; 438/96; 438/166; 438/458; 438/471; 438/486; 438/487; 257/52; 257/75; 257/770; 257/E21.09; 257/E21.347; 257/E21.567; 257/E29.003

(58) Field of Classification Search .................... 438/95, 438/96, 97, 166, 458, 471, 486, 487; 257/52, 257/75, 770, E21.09, E21.347, E21.567, 257/E29.003

See application file for complete search history.

(56) References Cited

U.S. PATENT DOCUMENTS

| | | | | |
|---|---|---|---|---|
| 5,963,823 | A * | 10/1999 | Yamazaki et al. | 438/487 |
| 7,585,749 | B2 * | 9/2009 | Hebras | 438/458 |
| 7,829,473 | B2 * | 11/2010 | Yoshizumi | 438/758 |
| 8,173,484 | B2 * | 5/2012 | Lim | 438/97 |
| 2010/0075458 | A1 * | 3/2010 | Roca I Cabarrocas et al. | 438/96 |
| 2011/0008952 | A1 | 1/2011 | Aoyama | |

FOREIGN PATENT DOCUMENTS

JP 8-195492 7/1996

OTHER PUBLICATIONS

Subramanian, et al., "High-Performance Germanium-Seeded Laterally Crystallized TFT's for Vertical Device Integration", IEEE Transactions on Electron Devices, vol. 45, No. 9, pp. 1934-1939, (Sep. 1998).

* cited by examiner

*Primary Examiner* — Dao H Nguyen

(74) *Attorney, Agent, or Firm* — Finnegan, Henderson, Farabow, Garrett & Dunner, L.L.P.

(57) ABSTRACT

In one embodiment, a method for manufacturing a semiconductor device is disclosed. The method can include depositing a first amorphous film having a first impurity, depositing a third amorphous lower-layer film on the first amorphous film, forming microcrystals on the third amorphous lower-layer film, depositing a third amorphous upper-layer film on the third amorphous lower-layer film to cover the microcrystals, depositing a second amorphous film having a second impurity on the third amorphous upper-layer film, and radiating microwaves to crystallize the third amorphous lower-layer film and the third amorphous upper-layer film to form a third crystal layer, and crystallize the first amorphous film and the second amorphous film to form a first crystal layer and a second crystal layer.

14 Claims, 12 Drawing Sheets

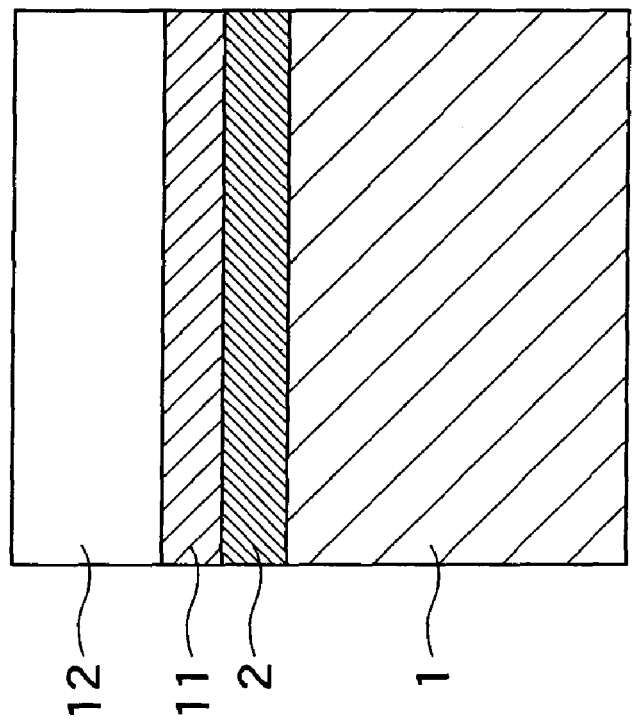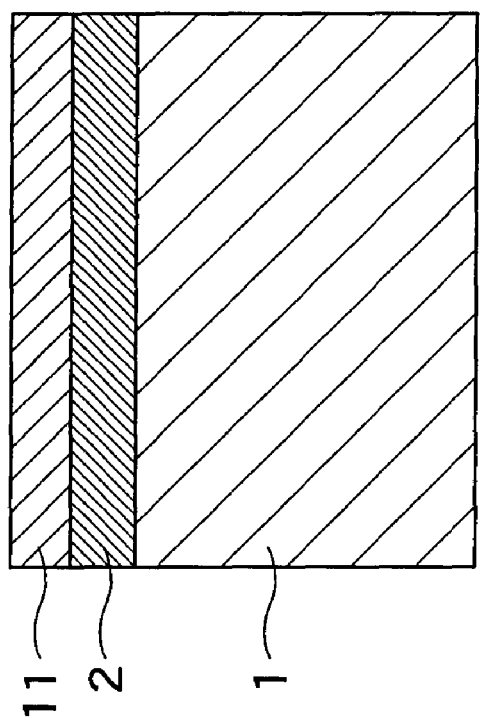
FIG. 2

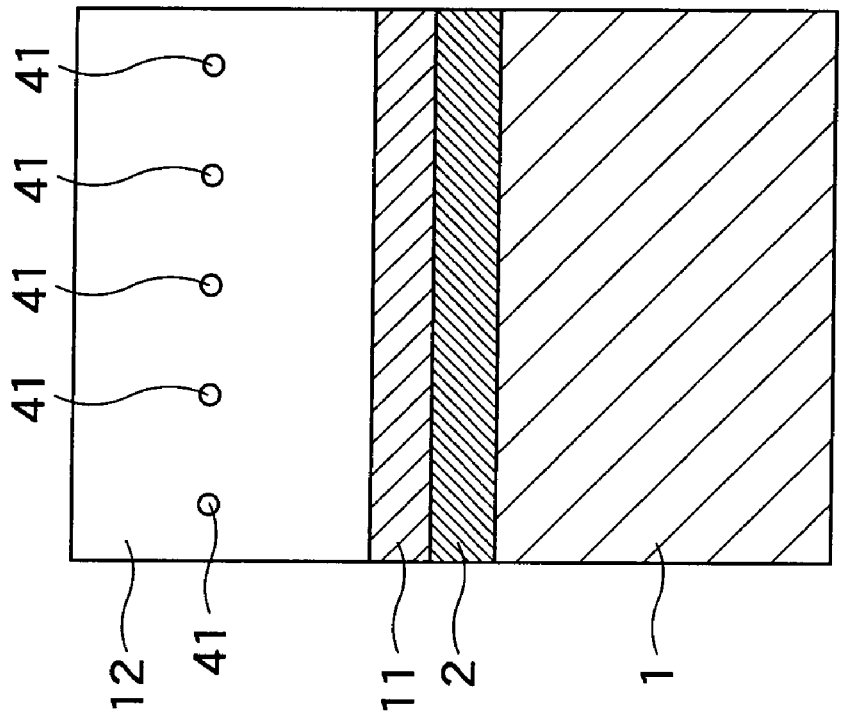
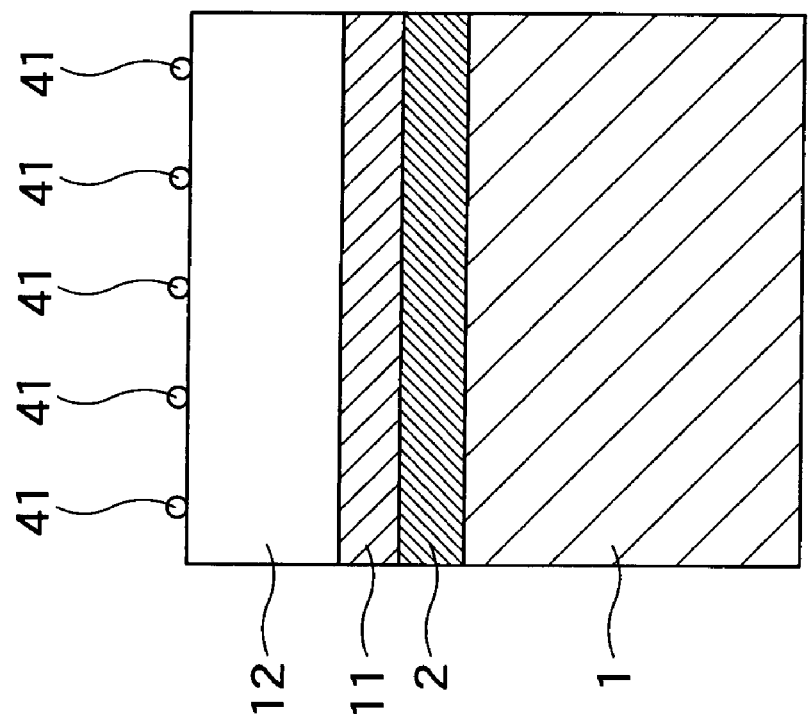
FIG. 3

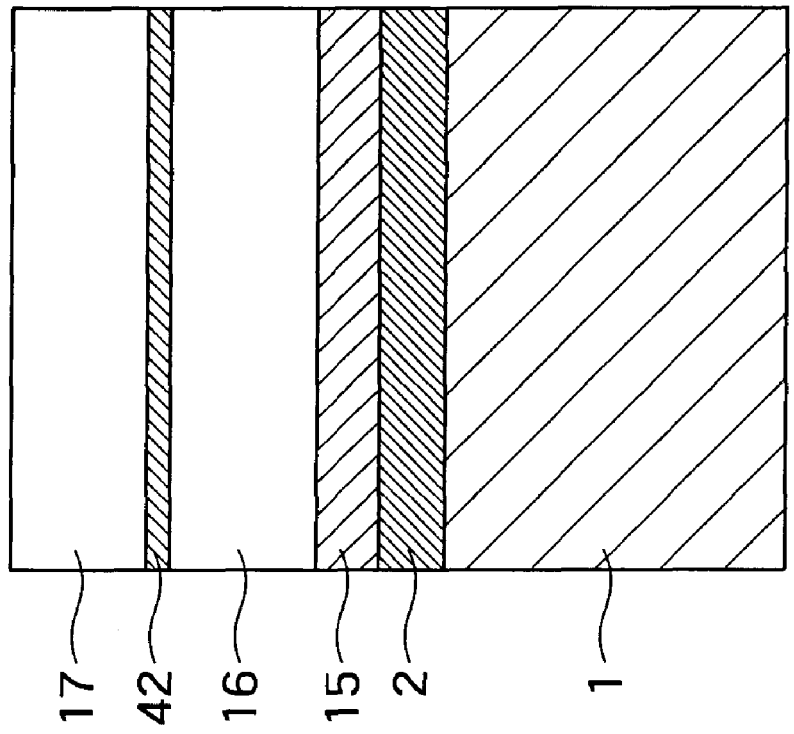
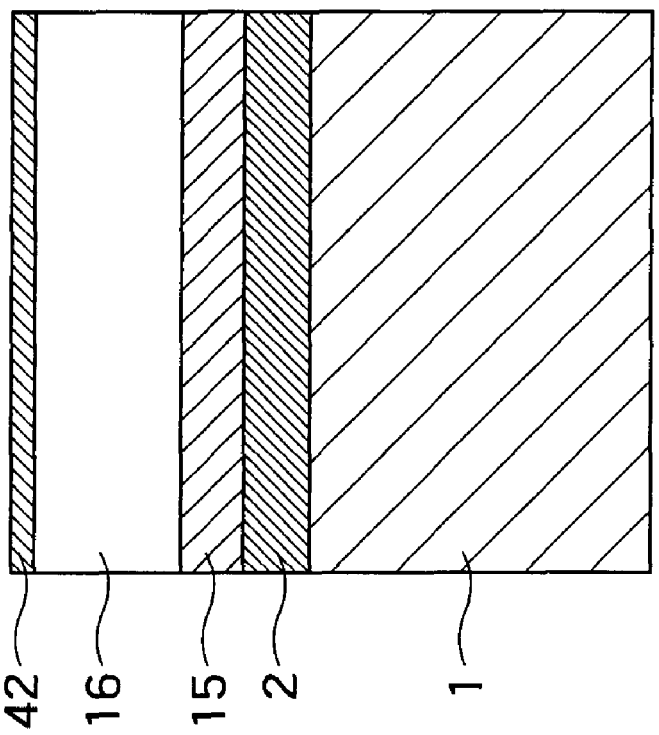
FIG. 7

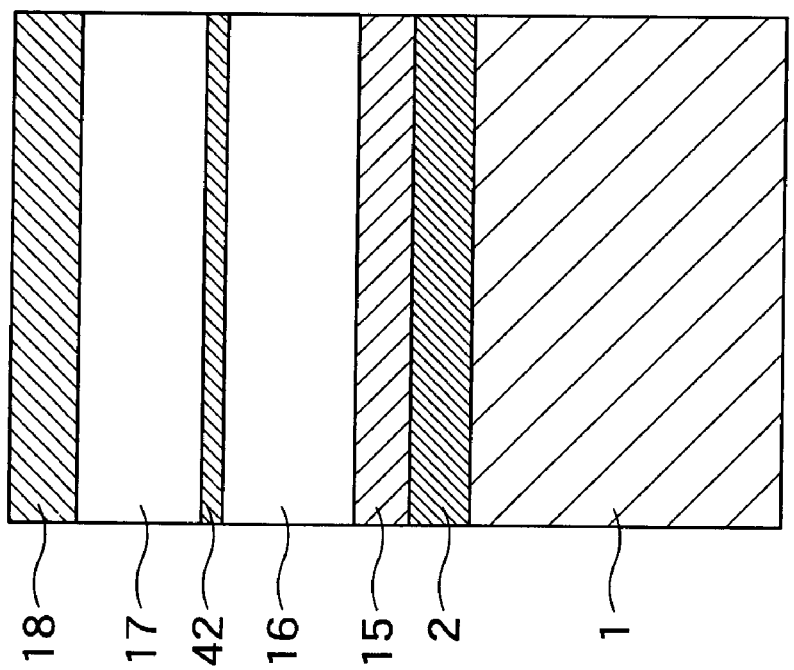
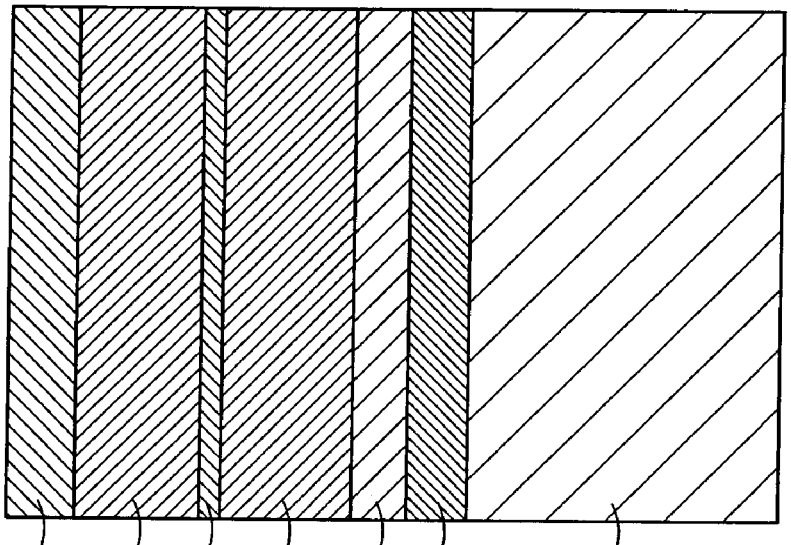
FIG. 8

US 8,383,452 B2

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2010-172608, filed on Jul. 30, 2010, the entire contents of which are incorporated herein by reference.

FILED

Embodiments described herein relate generally to a semiconductor device and a method for manufacturing the semiconductor device.

BACKGROUD

For three-dimensional memories of future generations, semiconductor devices that include selectors using silicon, such as diodes, are being considered.

For example, in a ReRAM (Resistance Change Random Access Memory) using a resistance change film, a selector is used to cause a current to flow in the resistance change film. Such a selector is formed by forming an amorphous film in advance, and crystallizing the amorphous film by RTA (Rapid Thermal Annealing).

BRIEF DESCRIPTION OF THE DRAWINGS

FIG. 2(a) is a diagram (a first diagram) for explaining a procedure for manufacturing a semiconductor device according to the first embodiment;

FIG. 2(b) is a diagram (a second diagram) for explaining a procedure for manufacturing the semiconductor device according to the first embodiment;

FIG. 3(a) is a diagram (a third diagram) for explaining a procedure for manufacturing the semiconductor device according to the first embodiment;

FIG. 3(b) is a diagram (a fourth diagram) for explaining a procedure for manufacturing the semiconductor device according to the first embodiment;

FIG. 7(a) is a diagram (a third diagram) for explaining a procedure for manufacturing the semiconductor device according to the second embodiment;

FIG. 7(b) is a diagram (a fourth diagram) for explaining a procedure for manufacturing the semiconductor device according to the second embodiment;

FIG. 8(a) is a diagram (a fifth diagram) for explaining a procedure for manufacturing the semiconductor device according to the second embodiment;

FIG. 8(b) is a diagram (a sixth diagram) for explaining a procedure for manufacturing the semiconductor device according to the second embodiment;

DETAILED DESCRIPTION

In one embodiment of the present invention, according to a method for manufacturing a semiconductor device, it is possible that a first amorphous film that has a first impurity added thereto is deposited, a third amorphous lower-layer film is deposited on the first amorphous film, microcrystals are formed on the third amorphous lower-layer film, a third amorphous upper-layer film is deposited on the third amorphous lower-layer film so as to cover the microcrystals, and a second amorphous film that has a second impurity added thereto is deposited on the third amorphous upper-layer film. According to the method, microwaves are radiated, so that the third amorphous lower-layer film and the third amorphous upper-layer film are crystallized to form a third crystal layer, and the first amorphous film and the second amorphous film are crystallized to form a first crystal layer and a second crystal layer.

(First Embodiment)

A first embodiment will be described hereafter. Although a method for forming a PIN diode will be described as an example in the following, the present invention is not limited to methods of manufacturing such semiconductor devices, but may also be applied to other types of transistors and the like, such as thin-film transistors.

Figure 4:
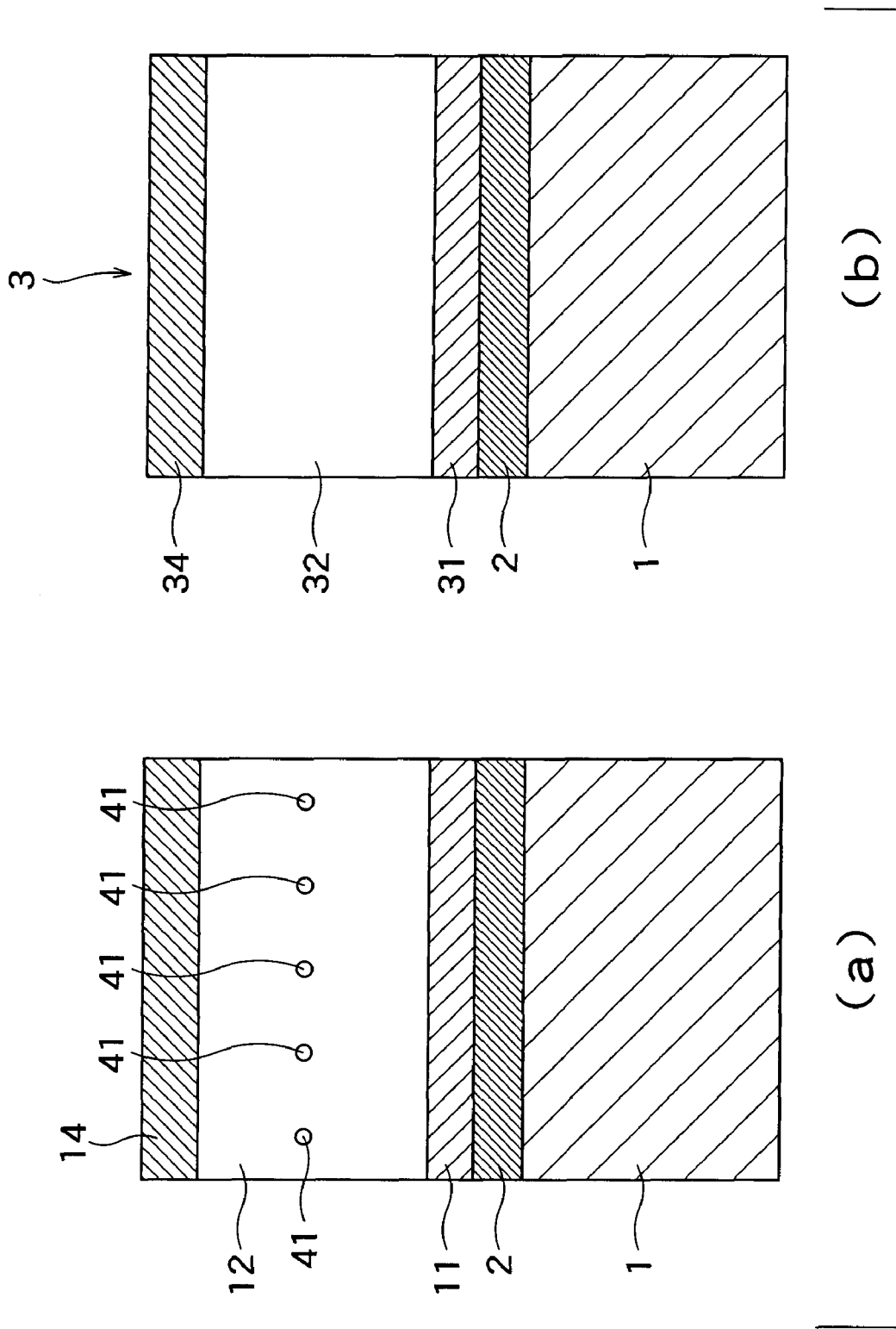
FIG. 4(a) is a diagram (a fifth diagram) for explaining a procedure for manufacturing the semiconductor device according to the first embodiment.
FIG. 4(b) is a diagram (a sixth diagram) for explaining a procedure for manufacturing the semiconductor device according to the first embodiment.

Referring now to FIGS. 2 through 4 illustrating a method for manufacturing a semiconductor device according to the first embodiment, the embodiment will be described. In all the drawings, like components are denoted by like reference numerals.

First, as shown in FIG. 2(a), an electrode 2 made of a titanium nitride film or the like is formed on a silicon substrate 1. A P-doped amorphous silicon film (a first amorphous film) 11 that has an impurity P (phosphorus) added thereto and has a thickness of 25 nm, for example, is formed on the electrode 2 at a substrate temperature of 500° C. by a CVD (Chemical Vapor Deposition) process using a $PH_3/Si_2H_6/He$ mixed gas and/or a $PH_3/SiH_4/He$ mixed gas.

Further, as shown in FIG. 2(b), an undoped amorphous silicon film (a third amorphous film) 12 that has no impurities added thereto and has a thickness of 20 nm, for example, is formed continuously on the P-doped amorphous silicon film 11 at a substrate temperature of 500° C. by a CVD process using a $SiH_4$ gas or a $Si_2H_6$ gas.

As shown in FIG. 3(a), microcrystals 41 are formed on the undoped amorphous silicon film 12 at a substrate temperature of 500° C. by a CVD process using a GeH$_4$ gas, without breaking the vacuum. The microcrystals 41 are, for example, 0.5 to 5 nm in diameter, and are preferably selected from among the microcrystals of indium, iridium, titanium, tantalum, cobalt, germanium, platinum, lanthanum, nickel, yttrium, hafnium, zirconium, tin, niobium, barium, strontium, magnesium, and silicon germanium. More preferably, the microcrystals 41 are germanium or silicon germanium. In the following, a case where germanium microcrystals 41 are used will be described.

As shown in FIG. 3(b), an undoped amorphous silicon film (a third amorphous film) 12 that has no impurities added thereto and has a thickness of 20 nm, for example, is further formed to cover the germanium microcrystals 41 and the already formed undoped amorphous silicon film 12, at a substrate temperature of 500° C. by a CVD process using a SiH$_4$ gas or a Si$_2$H$_6$ gas. In other words, an undoped amorphous silicon film 12 that contains the microcrystals 41 and has a thickness of 40 nm is formed.

As shown in FIG. 4(a), a B-doped amorphous silicon film (a second amorphous film) 14 that has an impurity B (boron) added thereto and has a thickness of 25 nm, for example, is further formed on the undoped amorphous silicon film 12 at a substrate temperature of 500° C. by a CVD process using a SiH$_4$/H$_2$/BCl$_3$ mixed gas or a Si$_2$H$_6$/H$_2$/BCl$_3$ mixed gas.

After that, microwave annealing is performed. More specifically, microwaves of 2.45 to 25 GHz are radiated. The conditions for microwave radiation are set so that the substrate temperature falls within the range of 200 to 550° C. For example, as the conditions for microwave radiation, the power of the microwaves is 0.5 W/cm$^2$ to 10 kW/cm$^2$, and the radiation time is 30 seconds to 30 minutes. At this point, the substrate temperature is obtained by measuring the surface of the B-doped amorphous silicon film 14 or the bottom surface of the substrate with the use of a pyrometer.

As described above, through the microwave radiation, the P-doped amorphous silicon film 11, the undoped amorphous silicon film 12, and the B-doped amorphous silicon film 14 are crystallized, to form a P-doped silicon crystal film (a first crystal layer) 31, an undoped silicon crystal film (a third crystal layer) 32, and a B-doped silicon crystal film (a second crystal layer) 34, respectively, as shown in FIG. 4(b).

Figure 1:
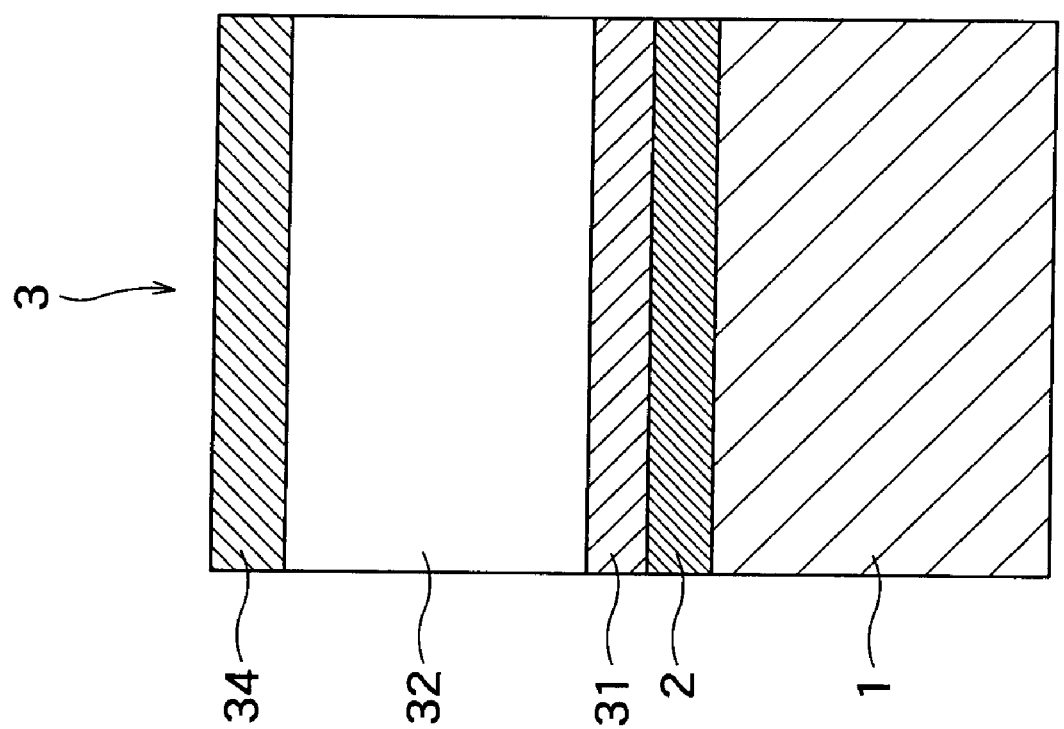
FIG. 1 is a schematic cross-sectional view of a semiconductor device according to a first embodiment.

In the above manner, a PIN diode 3 of 90 nm in thickness is formed as shown in FIG. 1, for example. More specifically, the PIN diode 3 shown in FIG. 1 includes: the P-doped silicon crystal film (the first crystal layer) 31 that has a thickness of 25 nm and has the impurity P added thereto, for example; the undoped silicon crystal film (the third crystal layer) 32 that is formed on the P-doped silicon crystal film 31, having no impurities added thereto, and having a thickness of 40 nm, for example; and the B-doped silicon crystal film (the second crystal layer) 34 that is formed on the undoped silicon crystal film 32, having a thickness of 25 nm, and having the impurity B added thereto. The undoped silicon crystal film 32 further contains germanium of the germanium microcrystals 41.

In the 90-nm thick PIN diode of the present embodiment formed in the above described manner and a PIN diode formed as a comparative example in the later described manner, the concentration distributions of the impurities B and P with respect to the depths from the upper surfaces of the respective PIN diodes were measured by SIMS (Secondary Ion Mass Spectrometry).

Specifically, the PIN diode in the comparative example is formed in the following manner. That is, a P-doped amorphous silicon film that has an impurity P added thereto and has a thickness of 25 nm is formed on an electrode, and an undoped amorphous silicon film that has no impurities added thereto and has a thickness of 40 nm is formed on the P-doped amorphous silicon film. A B-doped amorphous silicon film that has an impurity B (boron) added thereto and has a thickness of 25 nm is formed on the undoped amorphous silicon film. Further, RTA (Rapid Thermal Annealing) is performed under such conditions that the substrate temperature becomes 750° C., or more specifically, RTA is performed in a N$_2$ gas for 60 seconds.

In other words, unlike the PIN diode of the present embodiment, the PIN diode in the comparative example is formed without microcrystals and is formed through RTA, instead of microwave radiation. The other conditions for film formation in the comparative example are the same as those in the embodiment.

Figure 10:
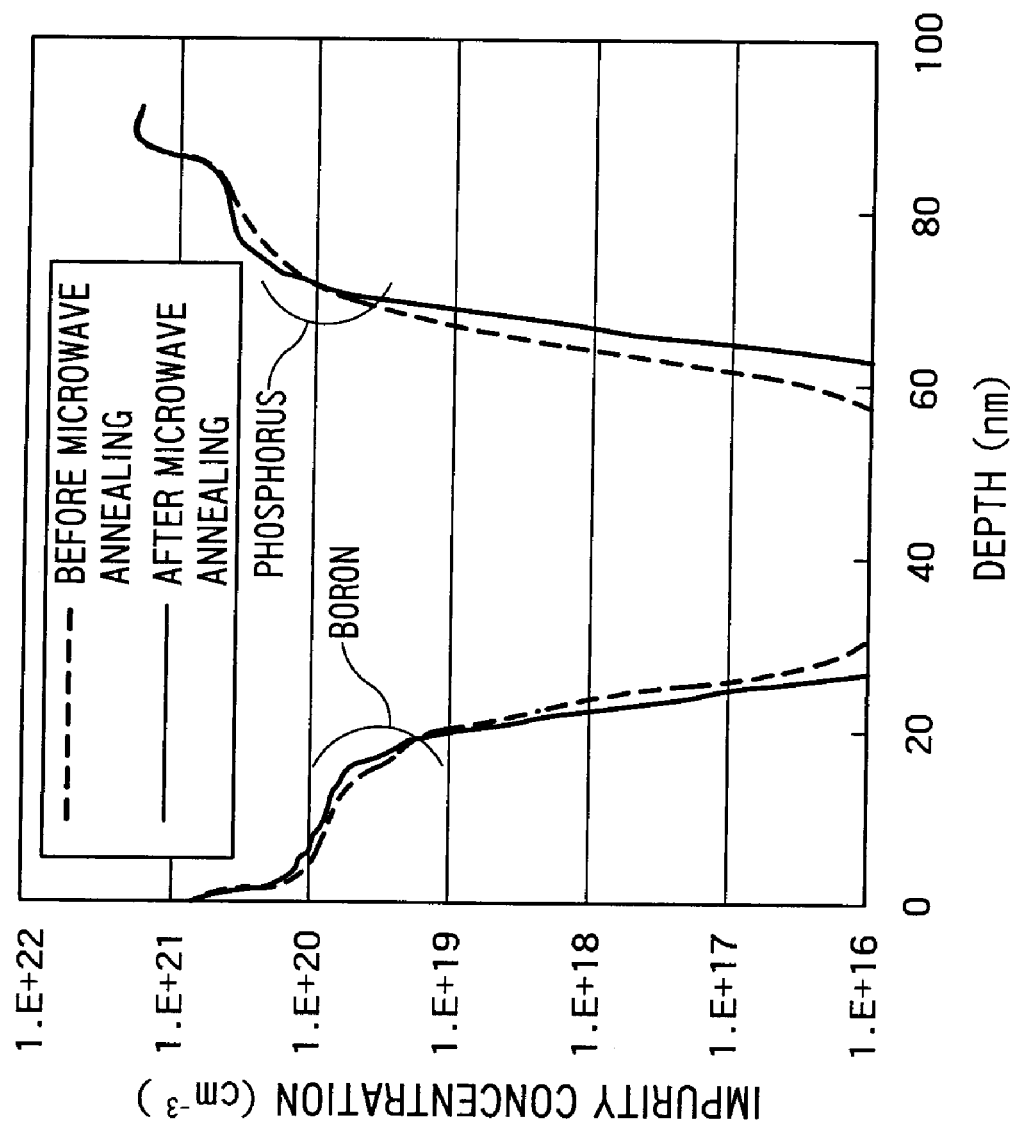
FIG. 10 is a diagram showing the concentration distributions of impurities with respect to the depth from the upper surface of the semiconductor device according to the first embodiment.

FIG. 10 shows the concentration distributions of the impurities B and P with respect to depth from the upper surface of the PIN diode of the present embodiment before and after microwave annealing. As can be seen from the graph, the impurity diffusion due to the annealing is restrained. The reason for this is supposedly as follows. Compared with infrared rays used in RTA, microwaves characteristically have high permeability into films. Therefore, combined with the effect of the formation of microcrystals in the films, microwave annealing can efficiently crystallize the insides of films at low temperatures. Accordingly, it is thought that impurity diffusion can be restrained, as crystallization can be performed at low temperatures.

In addition, as can be seen from FIG. 10, after the annealing, the impurity B is distributed in areas closer to the upper surface of the PIN diode, and the impurity P is distributed in areas deeper from the upper surface of the PIN diode, compared with the impurities B and P seen prior to the annealing. Further, the lines indicating the concentration distributions of the impurity B and the impurity P after the annealing rapidly go up and down in FIG. 10, and therefore, it can be seen from FIG. 10 that the impurity B and the impurity P are selectively distributed.

This is supposedly because the undoped amorphous silicon film 12, the P-doped amorphous silicon film 11, and the B-doped amorphous silicon film 14 are sequentially crystallized by the microwave annealing, having the microcrystals 41 at the center of the undoped amorphous silicon film 12 serve as seeds or nuclei. Accordingly, the crystal planes of the portions crystallized earlier in the vicinities of the microcrystals 41 existing in the undoped amorphous silicon film 12 grow with crystallization, and push back the impurities P and B contained in the P-doped amorphous silicon film 11 existing above the crystal planes and in the B-doped amorphous silicon film 14 existing below the crystal planes.

Figure 11:
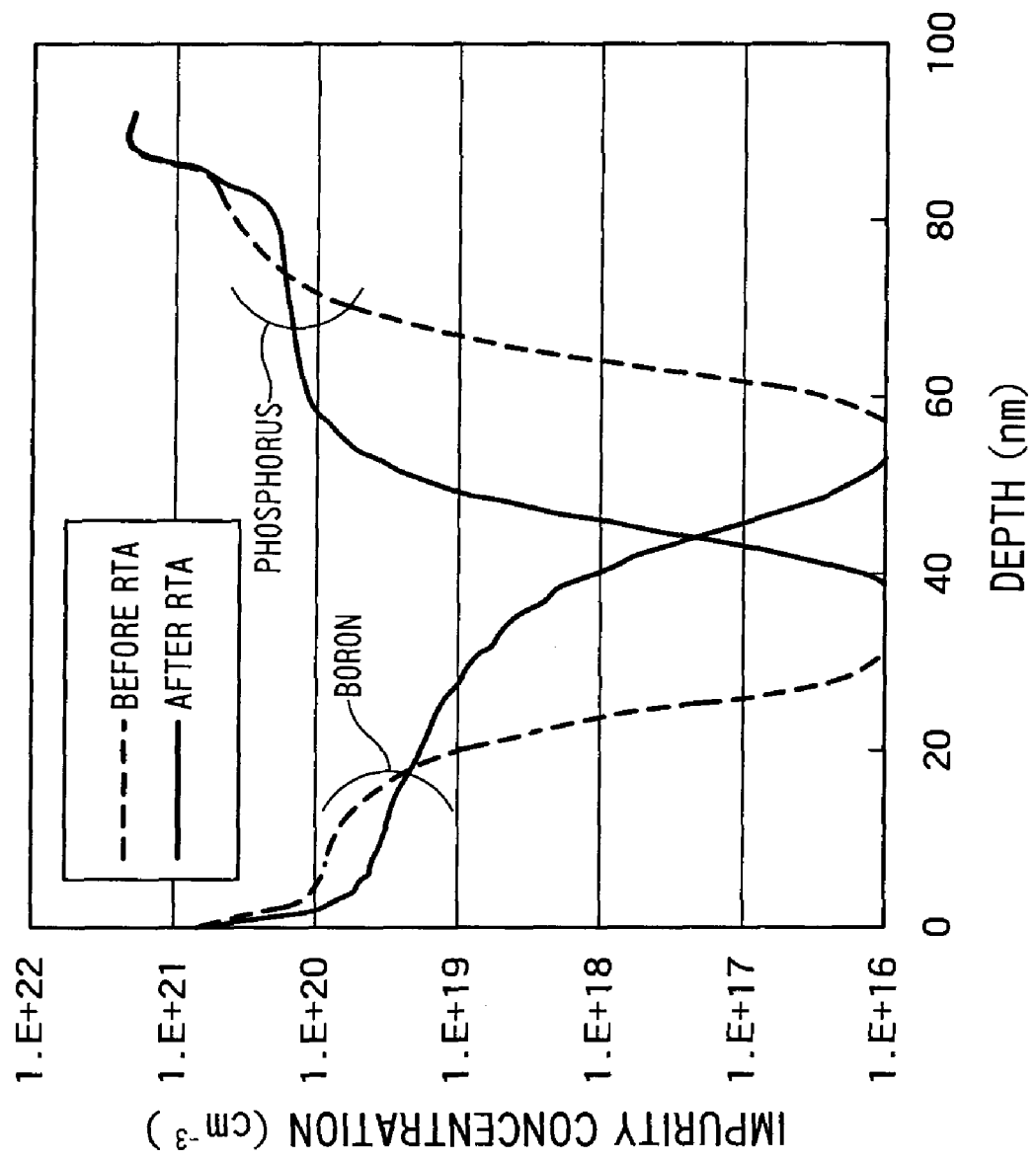
FIG. 11 is a diagram showing the concentration distributions of impurities with respect to the depth from the upper surface of a semiconductor device as a comparative example.

FIG. 11 shows the concentration distributions of the impurities B and P with respect to the depth from the upper surface of the PIN diode before and after the microwave annealing in the PIN diode of the comparative example. As can be seen from the graph, impurity diffusion is caused by the annealing according to RTA. More specifically, impurities diffuse and mix as deep as about 50 nm from the upper surface equivalent to the undoped silicon crystal film 32 in the PIN diode. As described above, in the PIN diode having impurities B and P diffused in the undoped silicon crystal film 32, or I layer, a problem of a large OFF current is caused.

Further, the current-voltage characteristics of the 90 nm thick PIN diode of the present embodiment formed in the above described manner and the PIN diode formed as the above described comparative example were measured. The PIN diode in this comparative example is the same as the PIN diode in the foregoing comparative example in which the concentration distributions of the impurities B and P with respect to the depth from the upper surface are measured described above.

Figure 12:
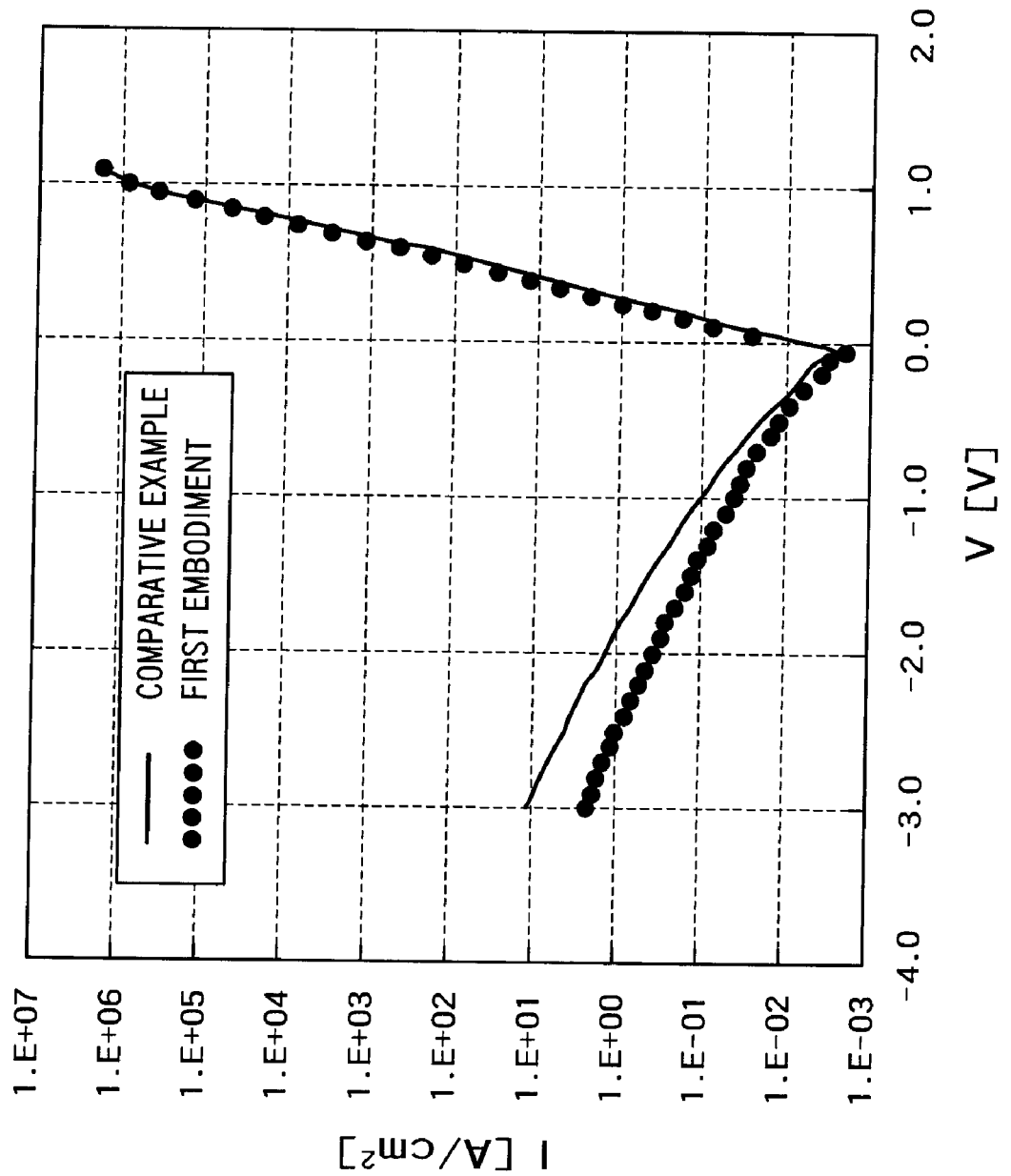
FIG. 12 is a diagram showing the voltage dependence characteristics of currents measured in the semiconductor device of the first embodiment and the semiconductor device as the comparative example.

FIG. 12 shows the measurement results. As can be seen from the graph, the forward current (the applied voltage being 0 V or higher) is about the same between the PIN diode of the embodiment and the PIN diode in the comparative example. The backward current (the applied voltage being 0 V or lower) of the PIN diode of the present embodiment is smaller in current value than the backward current of the PIN diode in the comparative example. That is, the PIN diode of the embodiment has a small OFF current.

Although PIN diodes have been described in the present embodiment, the embodiment may also be applied to NIP diodes.

(Second Embodiment)

A method for manufacturing a semiconductor device according to a second embodiment differs from the method for manufacturing a semiconductor device according to the first embodiment described above, in that a crystal film is used in place of the microcrystals, and a NPN selector is formed.

The following is a description of the second embodiment. Although a method for forming a NPN selector will be described as an example in the following, the present invention is not limited to methods of manufacturing such semiconductor devices, but may also be applied to other types of transistors and the like, such as thin-film transistors.

The present embodiment will be described with reference to FIGS. 6 through 9 illustrating a method for manufacturing a semiconductor device according to the second embodiment. In all the drawings, like components are denoted by like reference numerals.

First, as shown in FIG. 6(a), an electrode 2 made of a titanium nitride film or the like is formed on a silicon substrate 1, as in the first embodiment. A P-doped amorphous silicon film that has an impurity P (phosphorus) added thereto and has a thickness of 25 nm, for example, is formed on the electrode 2 at a substrate temperature of 500° C. by a CVD (Chemical Vapor Deposition) process using a $PH_3/Si_2H_6$/He mixed gas and/or a $PH_3/SiH_4$/He mixed gas. This P-doped amorphous silicon film serves as a P-doped amorphous silicon lower-layer film (a first amorphous film) 15.

Further, as shown in FIG. 6(b), an undoped amorphous silicon lower-layer film (a third amorphous film) 16 that has no impurities added thereto and has a thickness of 20 nm, for example, is formed on the P-doped amorphous silicon lower-layer film 15 at a substrate temperature of 500° C. by a CVD process using a $SiH_4$ gas or a $Si_2H_6$ gas, as in the first embodiment.

As shown in FIG. 7(a), a crystal film 42 is formed on the undoped amorphous silicon lower-layer film 16 at a substrate temperature of 500° C. by a CVD process using a $GeH_4$ gas, without breaking the vacuum. The crystal film 42 is formed to have a thickness of 0.5 to 50 nm. Material of the crystal film 42 is preferably selected from among indium, iridium, titanium, tantalum, cobalt, germanium, platinum, lanthanum, nickel, yttrium, hafnium, zirconium, tin, niobium, barium, strontium, magnesium, and silicon germanium. More preferably, the crystal film 42 is germanium or silicon germanium. In the following, a case where a germanium crystal film 42 is used will be described.

As shown in FIG. 7(b), an undoped amorphous silicon upper-layer film (a third amorphous film) 17 that has no impurities added thereto and has a thickness of 20 nm, for example, is further formed to cover the germanium crystal film 42 at a substrate temperature of 500° C. by a CVD process using a $SiH_4$ gas or a $Si_2H_6$ gas, as in the first embodiment.

As shown in FIG. 8(a), a P-doped amorphous silicon film that has an impurity P (phosphorus) added thereto and has a thickness of 25 nm, for example, is further formed on the undoped amorphous silicon upper-layer film 17 at a substrate temperature of 500° C. by a CVD process using a $PH_3/Si_2H_6$/He mixed gas or a $PH_3/SiH_4$/He mixed gas. This P-doped amorphous silicon film serves as a P-doped amorphous silicon upper-layer film (a second amorphous film) 18.

As shown in FIG. 8(b), ion implantation is then performed in the undoped amorphous silicon films 16 and 17 so that the boron concentration becomes about $1E17\ cm^{-3}$. In this manner, B-doped amorphous silicon films 26 and 27 having the impurity B (boron) added thereto are formed.

Figure 9:
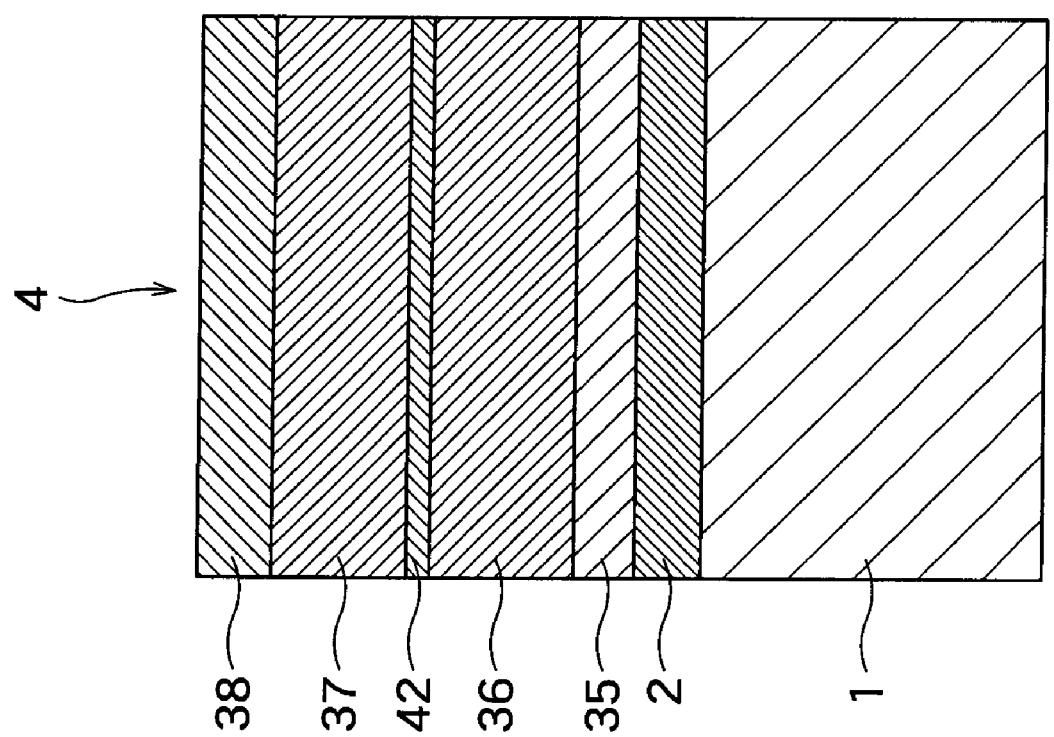
FIG. 9 is a diagram (a seventh diagram) for explaining a procedure for manufacturing the semiconductor device according to the second embodiment.

After that, microwaves of 2.45 to 25 GHz are radiated as shown in FIG. 9. The conditions for microwave radiation are set so that the substrate temperature falls within the range of 200 to 550° C., as in the first embodiment. More specifically, the power of the microwaves is $0.5\ W/cm^2$ to $10\ kW/cm^2$, and the radiation time is 30 seconds to 30 minutes. Through the microwave radiation performed in this manner, the P-doped amorphous silicon lower-layer film 15, the B-doped amorphous silicon films 26 and 27 having boron added thereto through the ion implantation, and the P-doped amorphous silicon upper-layer film 18 provided on the B-doped amorphous silicon film 27 are crystallized, to form a P-doped silicon crystal film (a first crystal lower layer) 35, B-doped silicon crystal films (second crystal layers) 36 and 37, and a P-doped silicon crystal film (a first crystal upper layer) 38 provided on the B-doped silicon crystal film 37, respectively.

Figure 5:
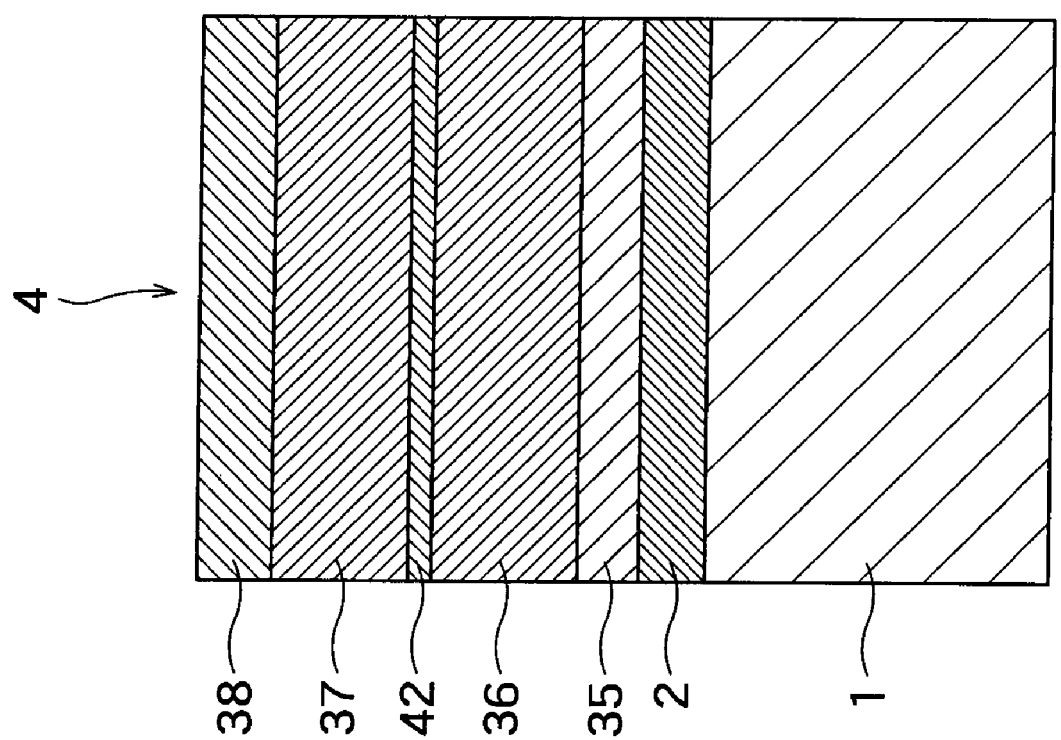
FIG. 5 is a schematic cross-sectional view of a semiconductor device according to a second embodiment.
Figure 6:
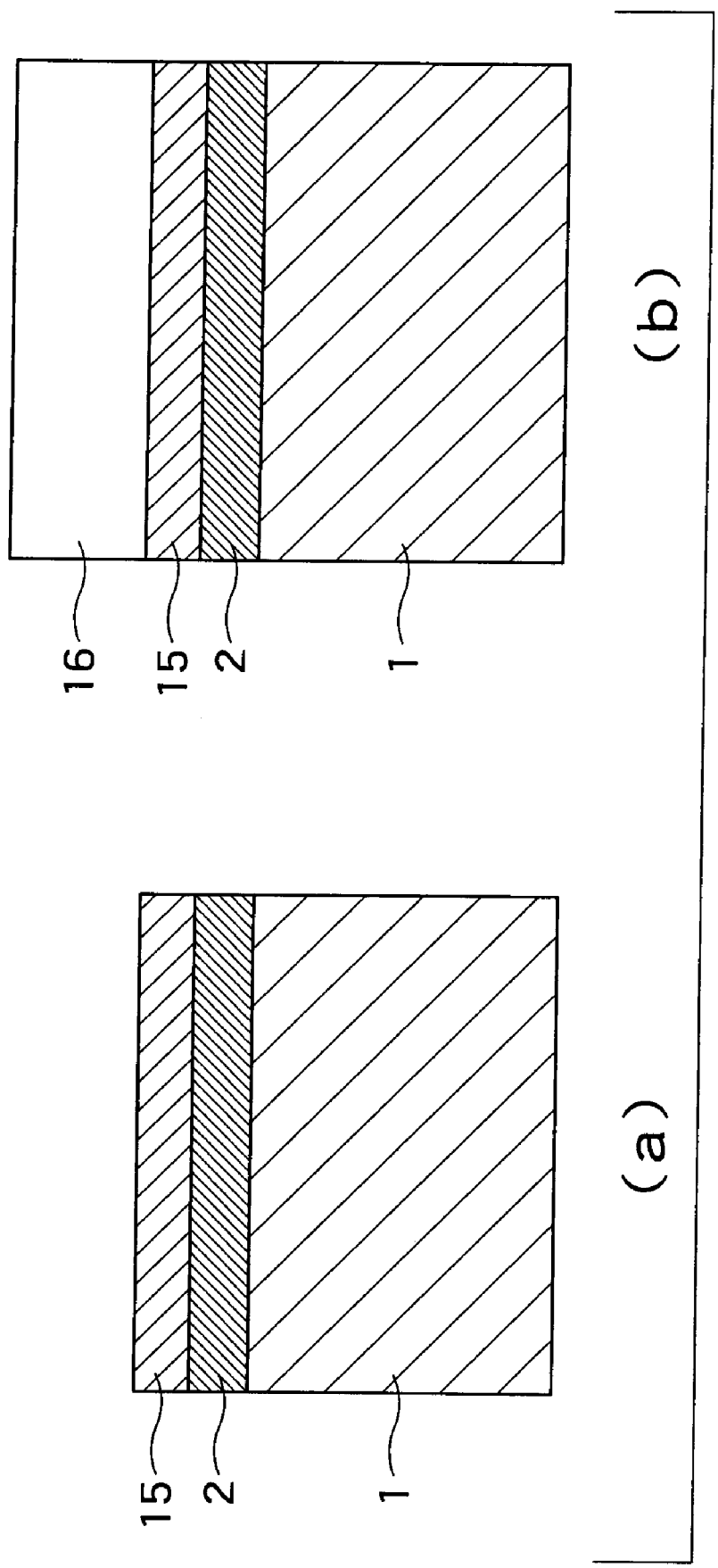
FIG. 6(a) is a diagram (a first diagram) for explaining a procedure for manufacturing a semiconductor device according to the second embodiment.
FIG. 6(b) is a diagram (a second diagram) for explaining a procedure for manufacturing the semiconductor device according to the second embodiment.

In the above manner, a NPN selector 4 shown in FIG. 5 is formed. More specifically, the NPN selector 4 shown in FIG. 5 includes: the P-doped silicon crystal film (the first crystal lower layer) 35 that has an impurity P added thereto; the B-doped silicon crystal films (the second crystal layers) 36 and 37 that are formed on the P-doped silicon crystal film 35; and the P-doped silicon crystal film (a first crystal upper layer) 38 that is formed on the B-doped silicon crystal film 37. The B-doped silicon crystal films 36 and 38 further contain the germanium crystal film 42.

Although a NPN selector has been described in the present embodiment, the embodiment may also be applied to PNP selectors.

In the above described first and second embodiments, selectors are formed on silicon substrates. However, a substrate on which a selector is to be formed is not necessarily a silicon substrate, and may be some other kind of substrate (such as a SOI substrate or a SiGe substrate).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method for manufacturing a semiconductor device, comprising:
    depositing a first amorphous film that has a first impurity added thereto;

depositing a third amorphous lower-layer film on the first amorphous film;

forming microcrystals on the third amorphous lower-layer film;

depositing a third amorphous upper-layer film on the third amorphous lower-layer film, the third amorphous upper-layer film covering the microcrystals;

depositing a second amorphous film on the third amorphous upper-layer film, the second amorphous film having a second impurity added thereto; and radiating microwaves to crystallize the third amorphous lower-layer film and the third amorphous upper-layer film to form a third crystal layer, and crystallize the first amorphous film and the second amorphous film to form a first crystal layer and a second crystal layer.

2. The method for manufacturing a semiconductor device according to claim 1, wherein, microcrystals selected from the group consisting of indium, iridium, titanium, tantalum, cobalt, germanium, platinum, lanthanum, nickel, yttrium, hafnium, zirconium, tin, niobium, barium, strontium, magnesium, and silicon germanium are used as the microcrystals.

3. The method for manufacturing a semiconductor device according to claim 1, wherein one of germanium and silicon germanium is used as the microcrystals.

4. The method for manufacturing a semiconductor device according to claim 1, wherein, by radiating the microwaves, the first amorphous film, the second amorphous film, the third amorphous lower-layer film, and the third amorphous upper-layer film are heated so that substrate temperatures thereof are raised to 200 to 550° C.

5. The method for manufacturing a semiconductor device according to claim 1, wherein the microwaves are radiated under conditions that frequency is 2.45 to 25 GHz, power is 0.5 W/cm$^2$ to 10 kW/cm$^2$, and radiation time is 30 seconds to 30 minutes.

6. The method for manufacturing a semiconductor device according to claim 1, further comprising depositing the first amorphous film on an electrode film.

7. The method for manufacturing a semiconductor device according to claim 1, wherein amorphous silicon films are used as the first amorphous film, the second amorphous film, the third amorphous lower-layer film, and the third amorphous upper-layer film.

8. A method for manufacturing a semiconductor device, comprising:

depositing a first amorphous film that has a first impurity added thereto;

depositing a third amorphous lower-layer film on the first amorphous film;

forming a crystal film on the third amorphous lower-layer film;

depositing a third amorphous upper-layer film on the third amorphous lower-layer film, the third amorphous upper-layer film covering the crystal film;

depositing a second amorphous film on the third amorphous upper-layer film, the second amorphous film having the first impurity added thereto;

implanting a second impurity into the third amorphous lower-layer film and the third amorphous upper-layer film; and radiating microwaves to crystallize the third amorphous lower-layer film and the third amorphous upper-layer film to form a third crystal layer, and crystallize the first amorphous film and the second amorphous film to form first crystal layers and second crystal layers.

9. The method for manufacturing a semiconductor device according to claim 8, wherein, a crystal film selected from the group consisting of indium, iridium, titanium, tantalum, cobalt, germanium, platinum, lanthanum, nickel, yttrium, hafnium, zirconium, tin, niobium, barium, strontium, magnesium, and silicon germanium is used as the crystal film.

10. The method for manufacturing a semiconductor device according to claim 8, wherein one of germanium and silicon germanium is used as the crystal film.

11. The method for manufacturing a semiconductor device according to claim 8, wherein, by radiating the microwaves, the first amorphous film, the second amorphous film, the third amorphous lower-layer film, and the third amorphous upper-layer film are heated so that substrate temperatures thereof are raised to 200 to 550° C.

12. The method for manufacturing a semiconductor device according to claim 8, wherein the microwaves are radiated under conditions that frequency is 2.45 to 25 GHz, power is 0.5 W/cm$^2$ to 10 kW/cm$^2$, and radiation time is 30 seconds to 30 minutes.

13. The method for manufacturing a semiconductor device according to claim 8, further comprising depositing the first amorphous film on an electrode film.

14. The method for manufacturing a semiconductor device according to claim 8, wherein amorphous silicon films are used as the first amorphous film, the second amorphous film, the third amorphous lower-layer film, and the third amorphous upper-layer film.

* * * * *